(12) United States Patent  
Adachi

(10) Patent No.: US 8,078,424 B2
(45) Date of Patent: Dec. 13, 2011

(54) TEST APPARATUS

(75) Inventor: Toshiaki Adachi, Gunma (JP)

(73) Assignee: Advantest Corporation, Tokyo (JP)

( * ) Notice: Subject to any disclaimer, the term of this patent is extended or adjusted under 35 U.S.C. 154(b) by 521 days.

(21) Appl. No.: 12/240,387

(22) Filed: Sep. 29, 2008

(65) Prior Publication Data

US 2010/0082284 A1 Apr. 1, 2010

(51) Int. Cl.
G01R 31/00 (2006.01)

(52) U.S. Cl. ........ 702/120; 702/121; 702/122; 702/123; 702/124

(58) Field of Classification Search ........... 702/120, 702/121–124; 714/718, 724, 728, 744
See application file for complete search history.

(56) References Cited

U.S. PATENT DOCUMENTS

| | | | | |
|---|---|---|---|---|
| 4,403,297 A | * | 9/1983 | Tivy | 702/122 |
| 4,807,161 A | * | 2/1989 | Comfort et al. | 702/121 |
| 5,025,205 A | | 6/1991 | Mydill et al. | |
| 7,184,917 B2 | * | 2/2007 | Pramanick et al. | 702/120 |

FOREIGN PATENT DOCUMENTS

JP 3-128473 5/1991

* cited by examiner

Primary Examiner — Eliseo Ramos Feliciano
Assistant Examiner — Elias Desta
(74) Attorney, Agent, or Firm — Osha • Liang LLP

(57) ABSTRACT

Provided is a test apparatus 10, which includes: a plurality of test modules 150, each of which is connected to any of the plurality of devices under test 100 to supply a test signal to the connected device under test 100; a plurality of site controllers 130 that control the plurality of test modules 150 to test the respective plurality of devices under test 100 simultaneously; a connection setting device 140 that sets a connection mode between the plurality of site controllers 130 and the plurality of test modules 150 so that each of the test modules 150 is connected to any of the plurality of site controllers 130; and a plurality of system controllers 110, each of which controls any of the plurality of site controllers 130, in which a predetermined system controller of the plurality of system controllers 110 assigns, in response to a request from another system controller of the system controllers, a site controller of the site controllers, which is to be controlled by the another system controller.

8 Claims, 6 Drawing Sheets

TEST APPARATUS

BACKGROUND

1. Technical field

The present invention relates to a test apparatus that tests electronic devices such as semiconductor devices. The invention particularly relates to a test apparatus that can be used by a plurality of users at the same time.

2. Related Art

A conventional inspection device is disclosed in JP03-128473 A (patent document 1). In order to execute at most, e.g., eight independent checking programs, the inspection device disclosed in patent document 1 is provided with at most eight controllers corresponding to those programs, and the eight independent checking program controllers are connected to a device configuration management device. More specifically, in the above conventional inspection device, the one configuration management device manages the eight independent program controllers (see FIG. 3).

However, with this conventional inspection device, a user always has to check an integrated circuit, using the device configuration management device connected in common to the plurality of checking program controllers, so it has been difficult with one inspection device for a plurality of users to flexibly conduct tests for a plurality of integrated circuits.

SUMMARY

In light of the above, the present invention has an object of providing a test apparatus that can solve the above problem. This object is achieved by combining the features recited in the independent claims in the scope of claims. The independent claims also stipulate further advantageous specific embodiments of the invention.

In order to achieve the above object, according to a first aspect of the invention, provided is a test apparatus that tests a plurality of devices under test, comprising: a plurality of test modules, each of which is connected to any of the plurality of devices under test to supply a test signal to the connected device under test; a plurality of site controllers that control the plurality of test modules to test the respective plurality of devices under test simultaneously; a connection setting device that sets a connection mode between the plurality of site controllers and the plurality of test modules so that each of the test modules is connected to any of the plurality of site controllers; and a plurality of system controllers, each of which controls any of the plurality of site controllers, wherein a predetermined system controller of the plurality of system controllers assigns, in response to a request from another system controller of the system controllers, a site controller of the site controllers, which is to be controlled by the another system controller.

In the test apparatus above, it is preferable that the predetermined system controller creates connection data showing the connection relationship between the site controller and the test module, which are assigned to the another system controller, in accordance with the request from the another system controller; and the connection setting device sets the connection mode between the plurality of site controllers and the plurality of test modules based on the connection data.

In the test apparatus, it is preferable that, after the connection setting device sets the connection mode, the predetermined system controller permits the another system controller to communicate with the assigned site controller.

In the test apparatus, it is preferable that the predetermined system controller assigns a site controller and a test module, from among the plurality of site controllers and the plurality of test modules, other than the site controller and the test module that have been already assigned, to the another system controller.

In the above test apparatus, the predetermined system controller may assign a plurality of site controllers to the another system controller, from among the plurality of site controllers, the plurality of site controllers being controlled by the another system controller.

In the test apparatus, it is preferable that the predetermined system controller determines the connection mode, which is set by the connection setting device, in accordance with a request from the another system controller.

In the test apparatus, a predetermined site controller of the plurality of the site controllers may be controlled by only the predetermined system controller.

In the above test apparatus, the plurality of devices under test may include a plurality of types of devices.

According to a second aspect of the invention, provided is a test apparatus that tests a device under test having a plurality of functional blocks, comprising: a plurality of test modules, each of which is connected to any of the plurality of functional blocks to supply a test signal to the connected functional block; a plurality of site controllers that control the plurality of test modules to test the respective plurality of functional blocks simultaneously; a connection setting device that sets a connection mode between the plurality of site controllers and the plurality of test modules so that each of the test modules is connected to any of the plurality of site controllers; and a plurality of system controllers, each of which controls any of the plurality of site controllers, wherein a predetermined system controller of the plurality of system controllers assigns, in response to a request from another system controller of the system controllers, a site controller of the site controllers, which is to be controlled by the another system controller.

The above test apparatus is further provided with a handler that conveys the device under test, and the handler may convey the device under test, for which the first functional block was tested by one system controller of the plurality of system controllers, so that a second functional block of the device under test is connected to the test module assigned to the another system controller.

In the test apparatus, the handler may convey the device under test having the first functional block when the device under test has passed the test for the first functional block.

DESCRIPTION OF EXEMPLARY EMBODIMENTS

The present invention will be described below through embodiments with reference to the accompanying drawings. However, the embodiments below do not limit the invention set forth in the scope of claims, and all the combinations of the features described in the embodiments are not always essential for the solving means of the invention.

Figure 1:
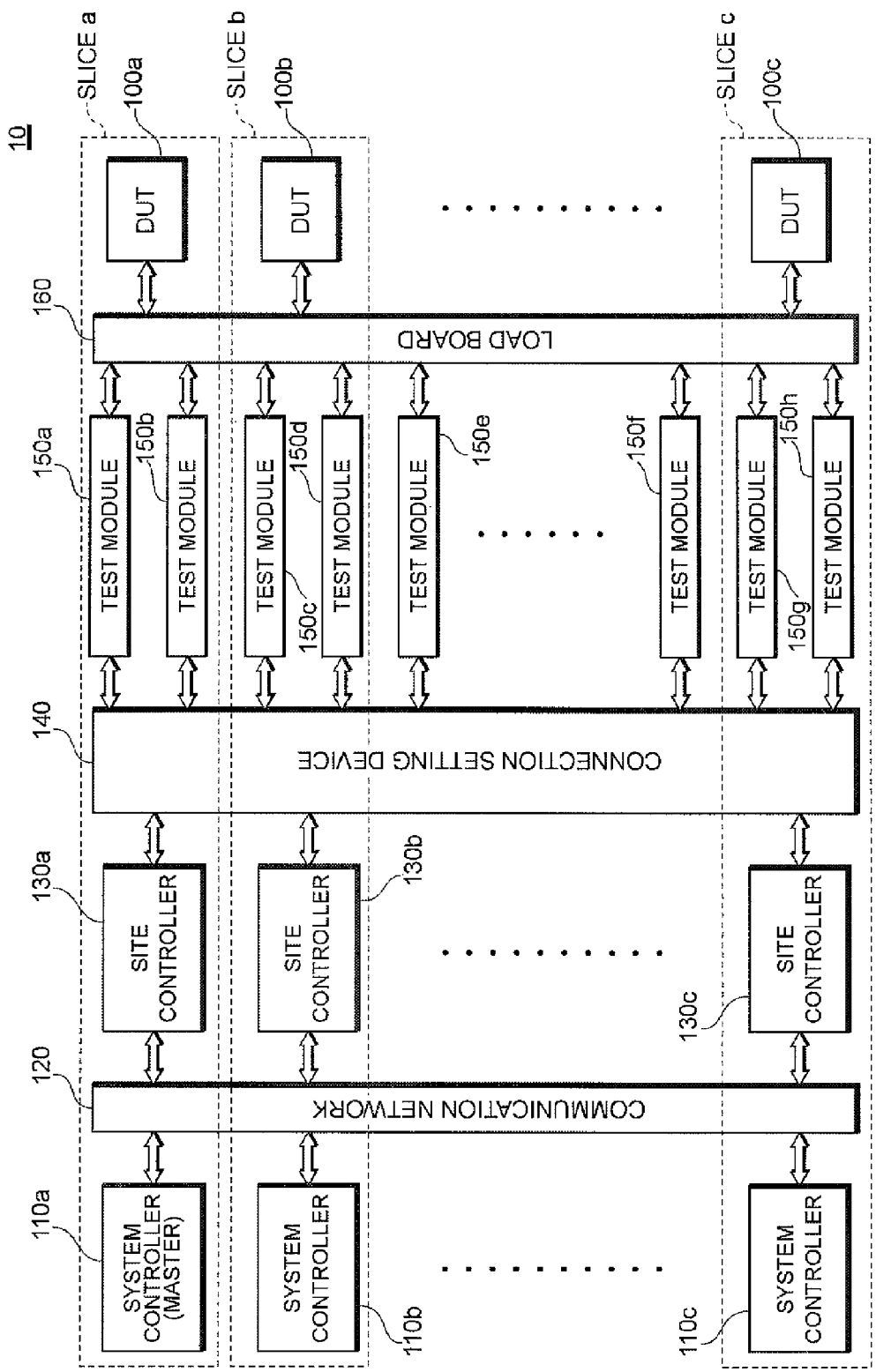
FIG. 1 shows an example of a configuration for a test apparatus 10 according to an embodiment of the invention.

FIG. 1 shows an example of a configuration for a test apparatus 10 according to an embodiment of the invention. The test apparatus 10 produces a test signal to supply it to a DUT 100 (Device Under Test), and judges the quality of the DUT 100 based on whether or not a result signal, which is output as a result of the operation of the DUT 100 in accordance with the test signal, matches an expected value. The test apparatus 10 according to this embodiment is realized by an open architecture, and a module based on an open architecture can be used as a test module 150 that supplies a test signal to the DUT 100.

The test apparatus 10 has a plurality of system controllers 110, and a user that uses each of the system controllers 110 arbitrarily combines site controllers 130 and test modules 150 to compose a slice in accordance with the form of the DUT 100 including the number of pins and the number of functional blocks of the DUT 100 and the content of a test. In this embodiment, a system controller 110a of the plurality of system controllers 110 functions as a master, and, in response to the requests from the other system controllers 110, assigns the site controllers 130 and the test modules 150 to those system controllers 110. As a result, a plurality of test slices can be composed in the one test apparatus 10, and a plurality of users can use that test apparatus 10. Specific configurations for the test apparatus 10 in this embodiment and the functions/operations of the respective configurations will be explained below with reference to FIG. 1. In this embodiment, the test apparatus 10 simultaneously tests a plurality of DUTs 100a-c of the same type.

The test apparatus 10 includes a plurality of system controllers 110a-c, a communication network 120, a plurality of site controllers 130a-c, a connection setting device 140, a plurality of test modules 150a-h, and a load board 160, and is connected to the DUT 100a-c. Note that, in each embodiment, regarding a plurality of components having the same configuration, like the system controllers 110, only the shown components having that configuration each are given a reference numeral accompanied by a letter (e.g., 110a), for convenience of explanation, but the attached letter does not limit the number of the components having that configuration.

The system controllers 110a-c store test control programs, test programs, test data, etc., which are used by the test apparatus 10 for conducting tests for the DUTs 100a-c, respectively. Also, the system controller 110a stores a management program for managing the system controllers 110a-c. The system controller 110a executes the management program on the system controller 110a, and manages the site controllers 130a-c and the test modules 150a-h, which are used by the system controllers 110a-c in the test apparatus 10.

In this embodiment, the system controller 110a configures a plurality of slices a-c in the test apparatus 10, as shown by dotted lines in the figure, so that the system controllers 110a-c can test the DUTs 100a-c to be tested by those system controllers 110a-c, respectively. More specifically, the system controller 110a assigns the site controller 130b and the test modules 150c-d to the system controller 110b in response to a request from the system controller 110b so that the system controller 110b can test the DUT 100b. Similarly, the system controller 110a assigns the site controller 130c and the test modules 150g-h to the system controller 110c in response to a request from the system controller 110c so that the system controller 110c can test the DUT 100c. Also, when a user tests the DUT 100a using the system controller 110a, the system controller 110a assigns the site controller 130a and the test modules 150a-b to itself.

The system controller 110a creates, in order to connect the site controllers 130a-c to the test modules 150a-d and g-h, which are assigned to the system controllers 110a-c, connection data showing the connection relationships, and transmits the connection data to the connection setting device 140.

The system controller 110a stores information concerning the already assigned site controllers 130a-c and test modules 150a-h, and manages the site controllers 130a-c and test modules 150a-h so as not to be double-assigned to another system controller 110. Also, for example, when a predetermined test terminates or when receiving a notice from any of the system controllers 110a-c, the system controller 110a releases the site controllers 130a-c and test modules 150a-h, which have been assigned for the above test or to the system controllers 110a-c so that the released site controllers 130a-c and test modules 150a-h can be assigned to another one of the system controllers 110a-c.

It is desirable that the management program always operates on the system controller 110a so that the system controller 110a can always manage assignment of the site controllers 130a-c, etc., with respect to the system controllers 110a-c. In this embodiment, the system controller 110a itself conducts a test for the DUT 100, like the other system controllers 110b-c; however, the system controller 110a may be a dedicated device for managing the other system controllers 110b-c, etc., while not conducting a test for the DUT 100 by itself.

The communication network 120 connects the system controllers 110a-c and the site controllers 130a-c to each other, and relays the communication between them. The communication network 120 also connects the system controller 110a and the system controllers 110b-c to each other, and relays the communication between them. The system controllers 110b-c each require the system controller 110a to conduct assignment of the site controllers 130a-c via the communication network 120. After the assignment of the site controllers 130a-c, the system controllers 110b-c communicate with the assigned site controllers 130b-c via the communication network 120, and control the site controllers 130b-c, respectively.

The site controllers 130a-c control the plurality of test modules a-h, and test the plurality of DUTs 100 simultaneously. Here, the site controllers 130a-c each control a test for one of the DUTs 100. For example, the site controller 130a is connected to the test modules 150a-b connected to the DUT 100a, thereby controlling a test for the DUT 100a. Also, the site controller 130b is connected to the test modules 150c-d connected to the DUT 100b, thereby controlling a test for the DUT 100b. Note that this embodiment has a configuration in which the plurality of site controllers 130a-c each control a test for one of the DUTs 100, but may have a configuration in which the plurality of site controllers 130a-c control a test for one of the DUTs 100.

More specifically, the site controllers 130a-c acquire test control programs from the system controllers 110 via the communication network 120, and execute the test control programs. The site controllers 130a-c then acquire the test programs and test data used for tests for the DUTs 100a-c, and store the programs and data in the test modules 150a-h used for the tests for the DUTs 100a-c via the connection setting device 140, based on the test control programs,. Next, the site controllers 130a-c instruct the test modules 150a-h to start tests based on the test programs and test data via the connection setting device 140. The site controllers 130a-c receive, e.g., interrupts each showing the termination of a test, from, for example, the test modules 150a-h, and have the respective modules conduct the next tests based on the test results. More specifically, the site controllers 130a-c control the test modules 150a-h in accordance with the test results for the DUTs 100, respectively, and simultaneously execute different test sequences with respect to the DUTs 100.

The connection setting device 140 sets a connection mode between the site controllers 130a-c and the test modules 150a-h in order to connect the site controllers 130a-c to the DUTs 100, respectively. More specifically, each of the site controllers 130a-c is connected to test modules, from among the test modules 150a-h, that are controlled by each of the site controllers 130a-c, and relays the communication between them.

The connection setting device 140 sets the connection mode between the site controllers 130a-c and the test modules 150a-h during tests conducted by the plurality of site controllers 130a-c for the DUTs 100, based on an instruction from one site controller 130 from among the site controllers 130a-c before the tests conducted by the site controllers 130a-c for the DUTs 100. For example, in FIG. 2, the site controller 130a is set to be connected to the test modules 150a-b, and a test for the DUT 100b is conducted using those test modules. Also, the site controller 130b is set to be connected to the test modules 150c-d, and a test for the DUT 100c is conducted using those test modules.

The DUTs 100 are mounted on the load board 160, which connects the test modules 150a-h to corresponding terminals of the DUTs 100. In this embodiment, the load board 160 is configured to mount all the DUTs 100a-c thereon; however, the test apparatus 10 may be configured to be provided with a plurality of load boards 160.

Figure 2:
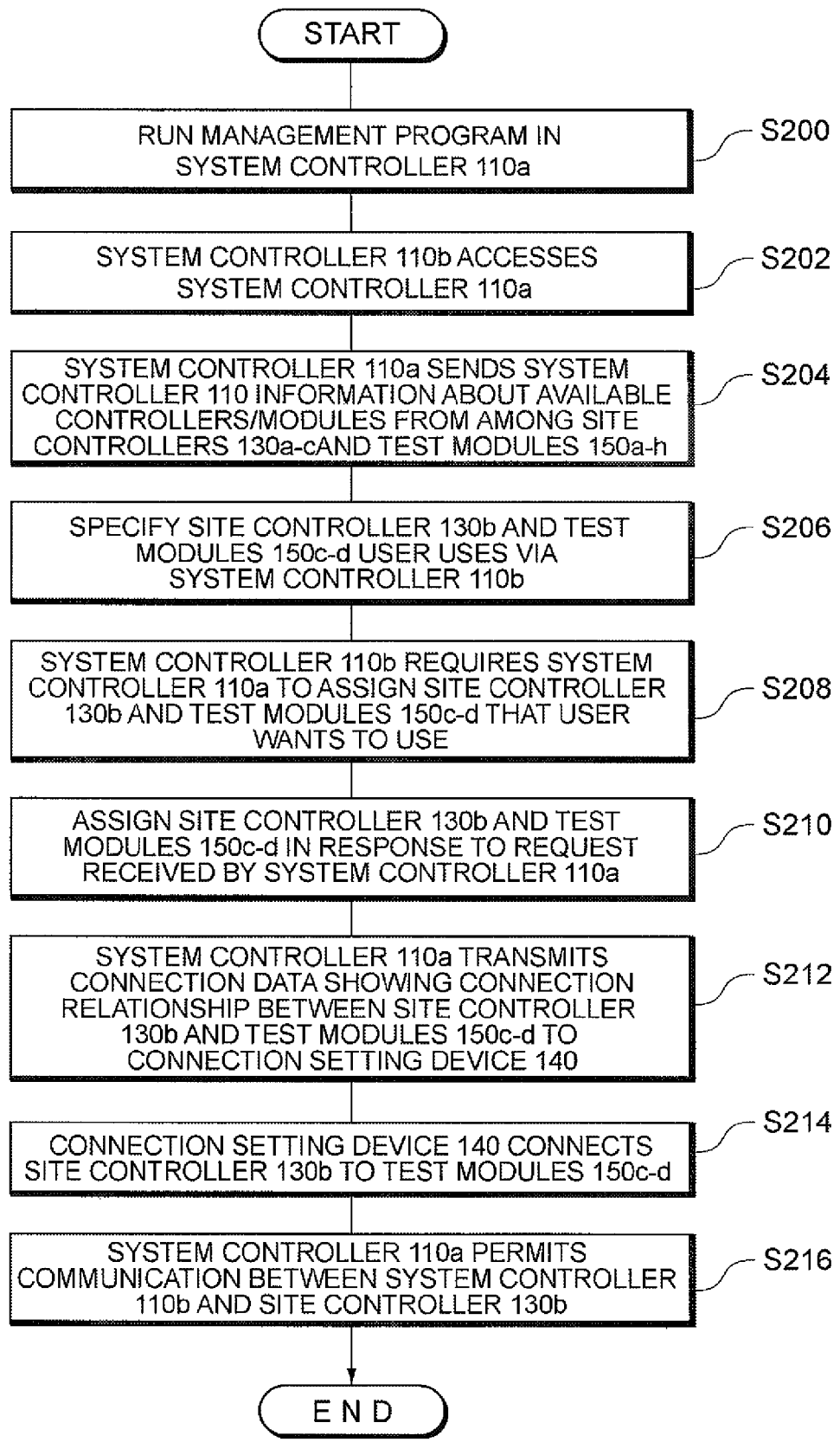
FIG. 2 is a flowchart of operation for establishing communication between, for example, a system controller 110b and a site controller 130b, in the test apparatus 10 shown in FIG. 1.

FIG. 2 is a flowchart of operation for establishing communication between, for example, the system controller 110b and the site controller 130b. This operation will be explained with reference to FIGS. 1 and 2.

First, in S200, the system controller 110a runs the management program. Then, in S202, the system controller 110b accesses the system controller 110a to request information about controllers/modules, from among the site controllers 130a-c and the test modules 150a-h, that are available to the system controller 110b. More specifically, the system controller 110b requires the system controller 110a to provide information about controllers/modules, from among the site controllers 130a-c and the test modules 150a-h, that have not been assigned to the other system controllers 110.

Next, in S204, in response to the above request, the system controller 110a sends the system controller 110b the information about controllers/modules, from among the site controllers 130a-c and the test modules 150a-h, that are available to the system controller 110b.

In S206, the system controller 110b displays the available controllers/modules, from among the site controllers 130a-c and the test modules 150a-h, based on the information received from the system controller 110a, and prompts a user to input controllers/modules, from among the site controllers 130a-c and the test modules 150a-h, that the user wants to use. The user then specifies the site controller 130a and the test modules 150c-d the user is to use via the system controller 110b.

In S208, the system controller 110b requires the system controller 110a to assign the site controller 130b and the test modules 150c-d to the system controller 110b.

Next in S210, the system controller 110a checks if the site controller 130b and the test modules 150c-d are still assignable, in response to the received request. If they are assignable, the system controller 110a assigns the site controller 130b and the test modules 150c-d to the system controller 110b. It is preferable that the system controller 110a stores a table showing the connection relationships between the system controllers 110a-c, the site controllers 130a-c, and the test modules 150a-h, and when new assignment of the site controllers 130a-c and the test modules 150a-h is conducted, the system controller 110a updates the table.

In S212, the system controller 110a requires the connection setting device 140 to connect the site controller 130b and the test modules 150c-d to each other. Specifically, the system controller 110a transmits the connection data showing the connection relationship between the site controller 130b and the test modules 150c-d. The system controller 110a also may transmit, as the connection data, data showing the connection relationships between all the site controllers 130a-c and all the test modules 150a-h to the connection setting device 140. The system controller 110a may also prompt the connection setting device 140 to refer to the table stored in the system controller 110a, the table showing the connection relationships between the site controllers 130a-c and the test modules 150a-h.

In S214, the connection setting device 140 connects the site controller 130b to the test modules 150c-d. After the site controller 130b and the test modules 150c-d are connected to each other, in S216, the system controller 110a permits communication between the system controller 110b and the site controller 130b. As a result, the system controller 110b, the site controller 130b, the test modules 150c-d, and the DUT 100b are electrically connected to one another, thereby forming the slice b. Accordingly, the test apparatus 10 is able to test the DUT 100b.

Figure 3:
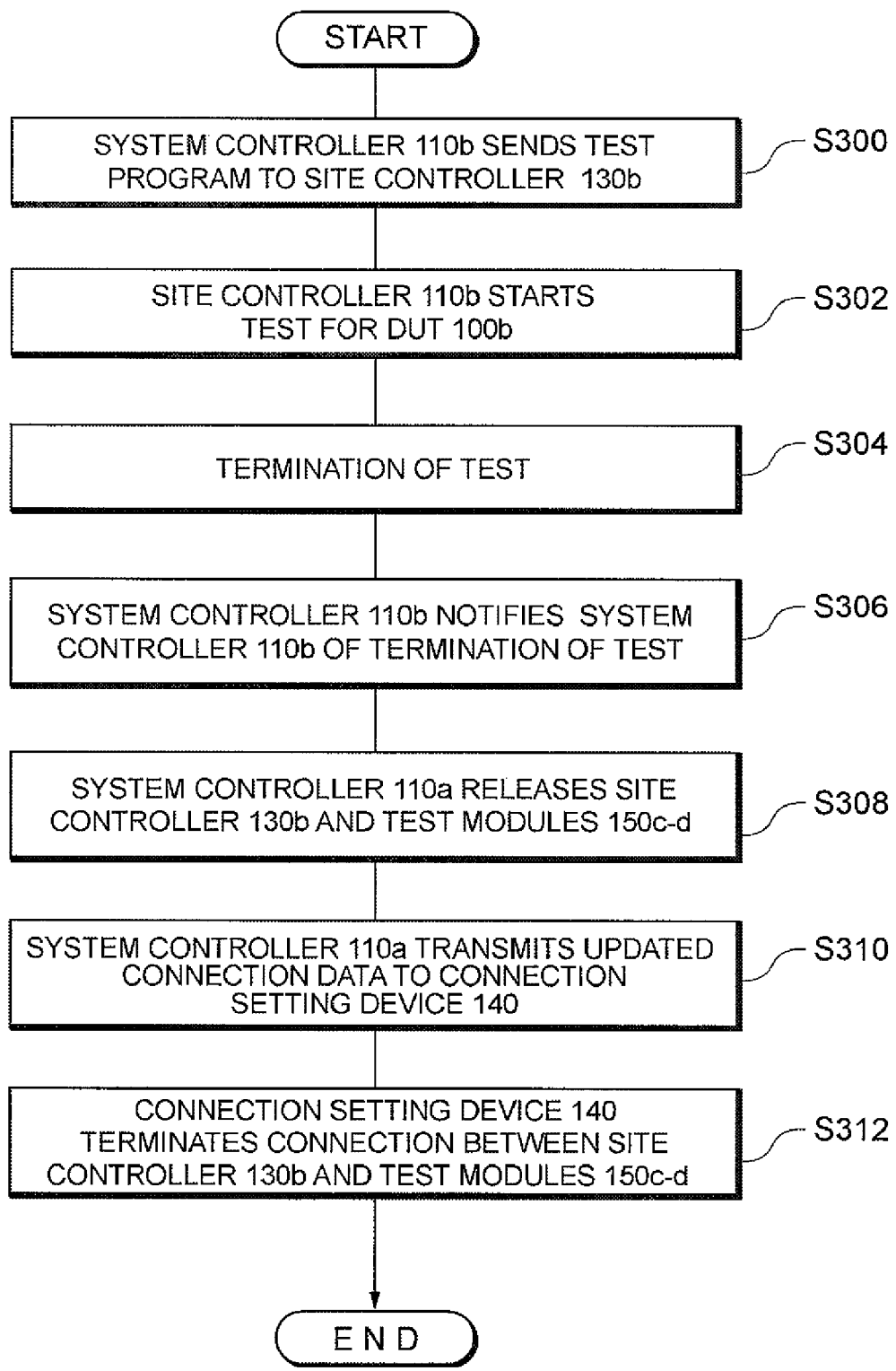
FIG. 3 is a flowchart of operation, for example, in which the system controller 110b tests a DUT 100b, in the test apparatus 10 shown in FIG. 1.

FIG. 3 is a flowchart of operation, for example, in which the system controller 110b tests the DUT 100b, in the test apparatus 10 shown in FIG. 1. The operation will be explained below with reference to FIGS. 1 and 3.

After the slice b is configured in the test apparatus 10 (see FIG. 2), in S300, the system controller 110b sends the test control program for testing the DUT 100b to the site controller 130b. The site controller 130b acquires the test program and test data used in the test for the DUT 100b from the system controller 110b based on that test control program.

Next, in S302, the site controller 130b sends the test program and test data to the test modules 150c-d. The test modules 150c-d each store the received test program and test data, and start the test for DUT 100b based on the test program and test data.

After the test for the DUT 100b terminates in S304, in S306, the system controller 110b notifies the system controller 110a of the termination of the test. Then, in S308, the system controller 110a releases the assignment of the site controller 130b and the test modules 150c-d.

In S310, the system controller 110a updates or newly creates connection data showing the connection relationship between the site controller 130b and the test modules 150c-d, and transmits the connection data to the connection setting device 140. The system controller 110a also may transmit, as the connection data, the data showing the connection relationships between all the site controllers 130a-c and all the test modules 150a-h to the connection setting device 140. The system controller 110a may also prompt the connection setting device 140 to refer to the table stored in the system controller 110a, the table showing the connection relationships between the site controllers 130a-c and the test modules 150a-h.

Next, in S312, the connection setting device 140 terminates the electrical connection between the site controller 130b and the test modules 150c-d. As a result, the slice b is released, and the site controller 130b and the test modules 150c-d become assignable to the system controllers 110a-c.

This embodiment has been described above with reference to FIGS. 1 to 3, however, the same operation is performed not only on the slices a and c but also on other slices (not shown). As a result, a plurality of users can use the test apparatus 10 at the same time.

Figure 4:
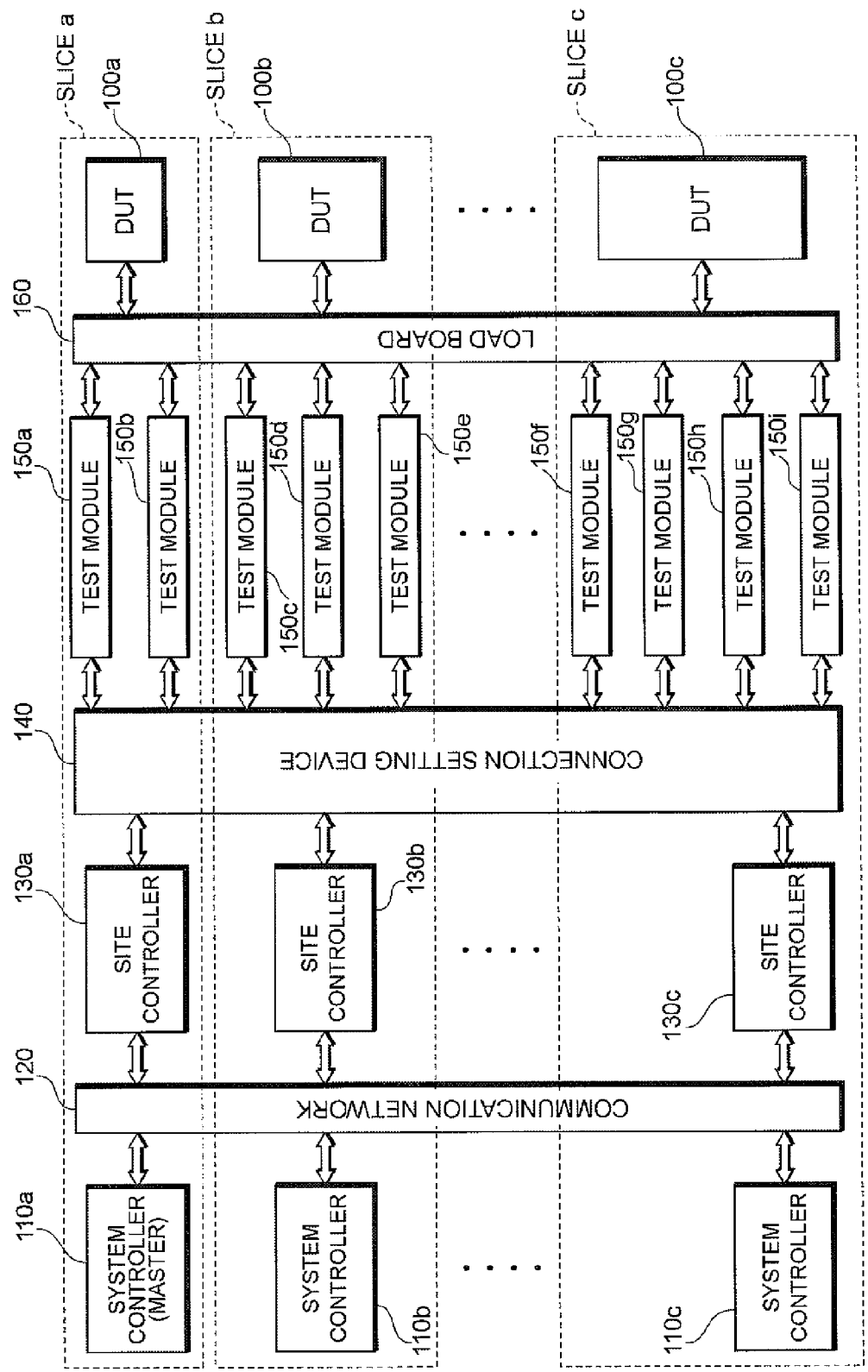
FIG. 4 is a diagram showing another example of a configuration for the test apparatus 10.

Also, as shown in FIG. 4, the test apparatus 10 may simultaneously test a plurality of DUTs 100a-c of different types. In this case, the number of test modules, from among the test modules 150a-i, that are connected to any of the site controllers 130a-c, differs between the site controllers 130a-c; however, the test apparatus 10 can test the DUTs 100a-c with the same operation as that explained with reference to FIGS. 1 to 3. Also in the test apparatus 10 shown in FIG. 1, the DUTs 100a-c of the same type may be tested with the respective site controllers 130a-c to which a different number of test modules from among the test modules 150a-h are connected.

Figure 5:
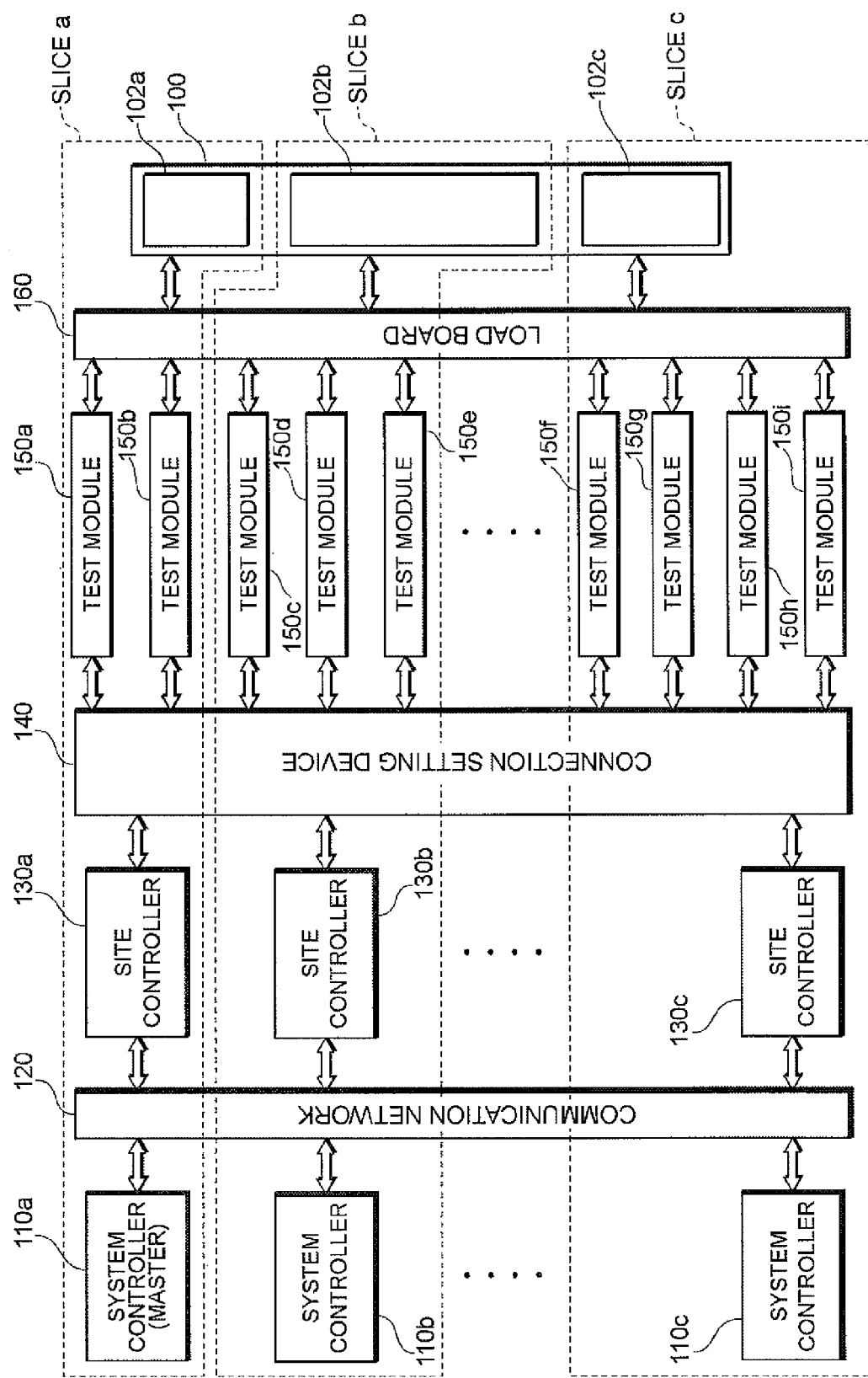
FIG. 5 is a diagram showing another example of a configuration for the test apparatus 10.

Also, as shown in FIG. 5, the test apparatus 10 may test the DUT 100 having a plurality of functional blocks 102a-c. In this case, the slices a-c are configured so that the system controllers 110a-c test the functional blocks 102a-c, respectively. The number of site controllers of the site controllers 130a-c and the number of test modules of the test modules 150a-i for a test for each of the functional blocks 102a-c are set in accordance with the number of pins, etc., for each of the functional blocks 102a-c. As a result, a plurality of users can test the functional blocks 102a-c simultaneously, using the one test apparatus 10 at the same time. Also, a test program for testing each of the functional blocks 102a-c can be made relatively simple. Moreover, the loads on the system controllers 110a-c can be reduced, since the functional blocks a-c can respectively be tested using the different system controllers 110a-c.

Figure 6:
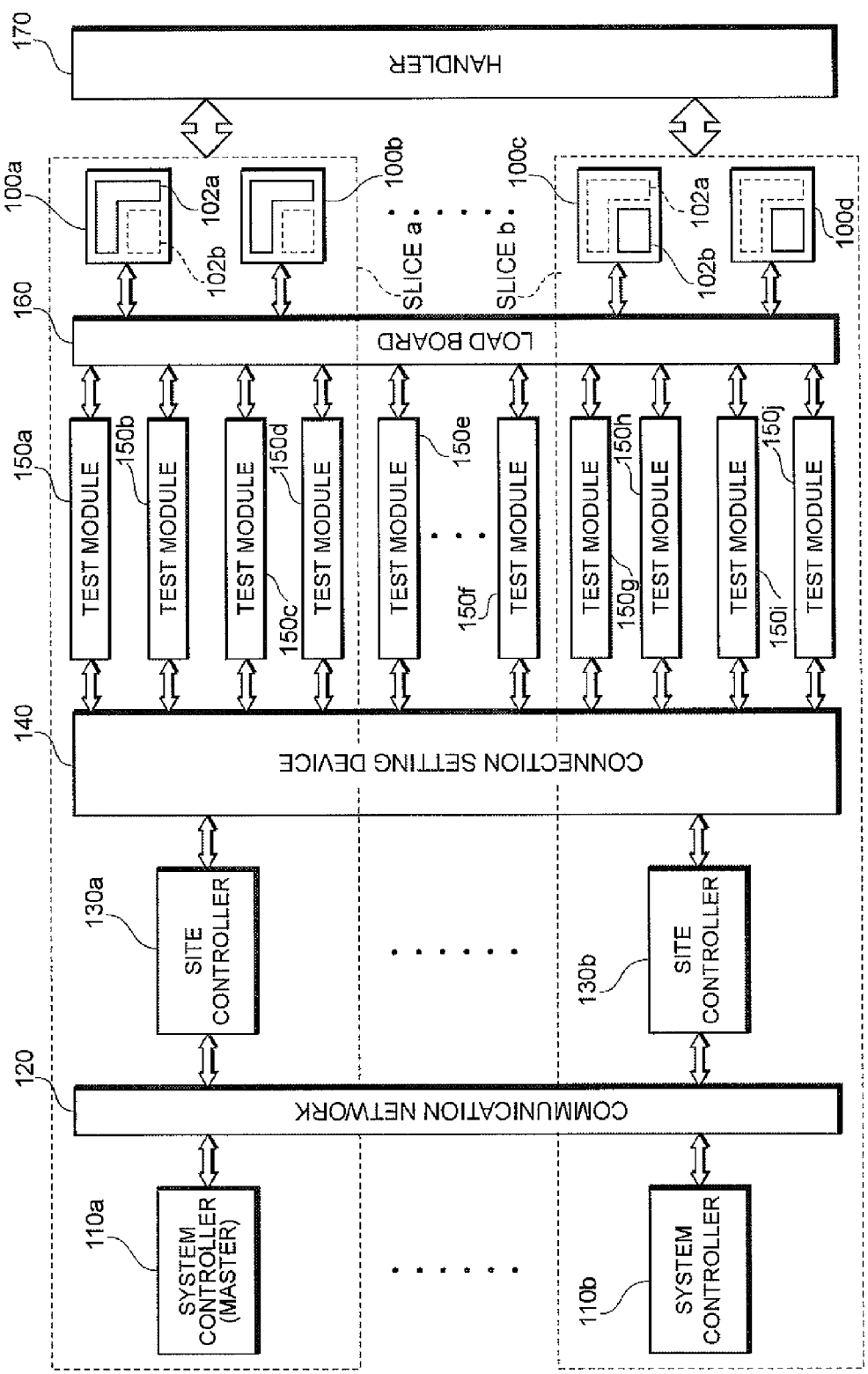
FIG. 6 is a diagram showing an example of a configuration for a test apparatus 10 according to another embodiment of the invention.

FIG. 6 is a diagram showing an example of a configuration for the test apparatus 10 according to another embodiment of the invention. The test apparatus 10 in this embodiment further includes a handler 170, in addition to the configuration for the test apparatus 10 in the embodiment relating to FIG. 1. The configuration and operation of the test apparatus 10 in this embodiment will be described below, while focusing on the difference from the test apparatus 10 in the embodiment relating to FIG. 1.

In this embodiment, DUTs 100a-d each have functional blocks a-b. In the slice a configured in the test apparatus 10, the respective functional blocks 102a in the DUTs 100a-b are tested, and in the slice b, the respective functional blocks 102b in the DUTs 100c-d are tested. More specifically, in the slices a-b, the functional blocks 102a-b in the DUTs 100a-d are tested simultaneously.

The test apparatus 10 is further provided with the handler 170, which conveys and mounts the DUTs 100a-d on the load board 160. The handler 170 is controlled by the system controller 110a. The handler 170 first mounts the DUTs 100a-d on a region assigned to the slice a in the load board 160. The handler 170 conveys the DUTs 100a-d based on the results of the tests for the DUTs 100a-d. More specifically, when a test for the functional block 102 in each of the DUTs 100a-d terminates in the slice a, the handler 170 conveys only DUTs, from among the DUTs 100a-d, that have passed the test in the slice a, to be tested in the slice b. Also, it is preferable that: when mounting of the DUTs 100a-d terminates, the handler 170 notifies each of the system controllers 110a-b of the termination; and the system controllers 110a-b start tests in the respective slices a-b based on the notification.

According to this embodiment, the test program for testing each of the functional blocks 102a-c can be made relatively simple. Also, the functional blocks 102a-c can respectively be tested using the different system controllers 110a-c, so the loads on the system controllers 110a-c can be reduced. Also, regarding DUTs, from among the DUTs 100a-d, each of which has passed a test for a particular functional block, those DUTs each are subjected to a test also for another functional block. Therefore, the DUTs 100a-d can be tested efficiently.

The examples and applications explained through the above embodiments can be used by being combined appropriately depending on use applications, or after being changed or improved, and the invention is not limited to the descriptions in the above embodiments. It is obvious from the descriptions in the scope of claims that forms resulting from the above combination, change, or improvement may be included in the technical scope of the invention.

What is claimed is:

1. A test apparatus that tests a plurality of devices under test, comprising:
   a plurality of test modules, each of which is connected to any of the plurality of devices under test to supply a test signal to the connected device under test;
   a plurality of site controllers that control the plurality of test modules to test the respective plurality of devices under test simultaneously;
   a connection setting device that sets a connection mode between the plurality of site controllers and the plurality of test modules so that each of the test modules is connected to any of the plurality of site controllers; and
   a plurality of system controllers, each of which controls any of the plurality of site controllers,
   wherein a predetermined system controller of the plurality of system controllers assigns, in response to a request from at least one other system controller from the plurality of system controllers, a site controller of the site controllers, which is to be controlled by the at least one other system controller.

2. The test apparatus according to claim 1, wherein:
   the predetermined system controller creates connection data showing the connection relationship between the site controller and the test module, which are assigned to the at least one other system controller, in accordance with the request from the at least one other system controller; and
   the connection setting device sets the connection mode between the plurality of site controllers and the plurality of test modules based on the connection data.

3. The test apparatus according to claim 2, wherein, after the connection setting device sets the connection mode, the predetermined system controller permits the at least one other system controller to communicate with the assigned site controller.

4. The test apparatus according to claim 2, wherein the predetermined system controller assigns a site controller and a test module, from among the plurality of site controllers and the plurality of test modules, other than the site controller and the test module that have been already assigned, to the at least one other system controller.

5. The test apparatus according to claim 1, wherein the predetermined system controller assigns a plurality of site controllers to the at least one other system controller, from among the plurality of site controllers, the plurality of site controllers being controlled by the at least one other system controller.

6. The test apparatus according to claim 1, wherein the predetermined system controller determines the connection mode, which is set by the connection setting device, in accordance with a request from the at least one other system controller.

7. The test apparatus according to claim 1, wherein the plurality of devices under test include a plurality of types of devices.

8. A test apparatus that tests a device under test having a plurality of functional blocks, comprising:
 a plurality of test modules, each of which is connected to any of the plurality of functional blocks to supply a test signal to the connected functional block;
 a plurality of site controllers that control the plurality of test modules to test the respective plurality of functional blocks simultaneously;
 a connection setting device that sets a connection mode between the plurality of site controllers and the plurality of test modules so that each of the test modules is connected to any of the plurality of site controllers; and
 a plurality of system controllers, each of which controls any of the plurality of site controllers,
 wherein a predetermined system controller of the plurality of system controllers assigns, in response to a request from at least one other system controller from the plurality of system controllers, a site controller of the site controllers, which is to be controlled by the at least one other system controller.

* * * * *